United States Patent [19]
Wilson

[11] Patent Number: 5,969,650
[45] Date of Patent: Oct. 19, 1999

[54] VARIABLE LENGTH CODER WITH A SMALL TABLE SIZE

[75] Inventor: William Brent Wilson, Coquitlam, Canada

[73] Assignee: Matsushita Electric Industrial Co., Ltd., Osaka, Japan

[21] Appl. No.: 09/008,601

[22] Filed: Jan. 16, 1998

[30] Foreign Application Priority Data

Jan. 17, 1997 [JP] Japan ......................................... 9-6527

[51] Int. Cl.$^6$ .................................................. H03M 7/40
[52] U.S. Cl. ............................................ 341/67; 341/106
[58] Field of Search ............................... 341/67, 65, 106; 712/210, 28

[56] References Cited

U.S. PATENT DOCUMENTS

| 4,044,347 | 8/1977 | Van Voorhis | 341/67 |
| 4,901,075 | 2/1990 | Vogel . | |
| 5,530,884 | 6/1996 | Sprague et al. | 341/67 |
| 5,638,067 | 6/1997 | Brent . | |

OTHER PUBLICATIONS

"Recommendation H.261—Video Codec for Audiovisual Services at px64 kbits/s" by International Telegraph and Telephone Consultative Committee, Study Group XV, CCIT Subgroup XV Document, Report R 37, Aug. 1990.

"CD 11172—Coding of Moving Pictures and Associated Audio for Digital Storage Media at up to about 1.5 Mbps" by International Organization for Standardization, ISO MPEG document, ISO–IEC/JTC1/SC2/WG8, 1992.

"IS13818—Generic Coding of Moving Pictures and Associated Audio" by International Organization for Standardization, ISO MPEG document, ISO–IEC/JTC1/SC2/WG11, 1994.

"An Entropy Coding System for Digital HDTV Applications", Shaw–Min Lei & Ming–Ting Sun, IEEE Transactions on Circuits and Systems for Video Technology, vol. 1, No. 1, Mar. 1991.

*Primary Examiner*—Brian Young
*Attorney, Agent, or Firm*—Wenderoth, Lind & Ponack, L.L.P.

[57] ABSTRACT

The invention described herein is a versatile variable length coder with a small table side. The size of the table was reduced by the use of a linked list of groups of like valued run-level code words for the code table, the effect of which is the ability to store and access the Huffman code words without reserving space for the holes in the Huffman tables. Traversing the linked list as the fixed length codes are input has the effect of eliminating the requirement that sequences of codes are run-level fixed length coded before being variable length coded. This simplifies encoder architectures and circuits. The result is the dramatic reduction in size of a programmable variable length coder, making them suitable for implementation in VLSI implementations of digital audio and video codecs.

12 Claims, 4 Drawing Sheets

VARIABLE LENGTH CODER WITH A SMALL TABLE SIZE

BACKGROUND OF THE INVENTION

1. Field of the Invention

This invention relates to the implementation of a run-level and variable length coder (also known as "Huffman Coder", or "entropy coder") for use in digital audio/video coders.

2. Description of the Related Art Including Information

In many digital video coders a lossy coding algorithm based on the discrete cosine transform (DCT) precedes a lossless encoder based on variable length coding (VLC). The transform coefficients are run-leveled and entropy coded, in which the most common runlevel combinations are given the shortest codes and the less common combinations longer codes. A run-level represents a group of 1 or more transform coefficients as a number of 0 coefficients (run) followed by a single coefficient value (level). For example, H.261 (see "Recommendation H.261—Video Codec for Audiovisual Services at p×64 kbits/s "by International Telegraph and Telephone Consultative Committee, Study Group XV, CCITT Subgroup XV Document, Report R 37, August 1990), MPEG-1(see "CD 11172—Coding of Moving Pictures and Associated Audio for Digital Storage Media at up to about 1.5 Mbps" by International Organization for Standardization, ISO MPEG Document, ISO-IEC/JTC1/SC2/WG8, 1992) and MPEG-2 (see "IS13818—Generic Coding of Moving Pictures and Associated Audio " by International Organization for Standardization, ISO MPEG Document, ISO-IEC/JTC1/SC2/WG11, 1994) describe audio/video codecs which require variable length coders. Emerging standard HDTV codecs will also require variable length coders.

The implementation of a run-level & variable length coder has typically been accomplished with the use of a run-level coder which counts the occurrences of zero valued codes in a sequence of codes preceding a non-zero code in order to make a new fixed length code containing the length of the run and the value of the first non-zero code. This run-level fixed length code is subsequently translated to a variable length code using a look-up code table. The index used to address the code table is the run-level fixed length code, or some subset of the run-level fixed length code. The code table is usually implemented using memory (for example RAM or PROM), or logic (for example PLA). Lei and Sun (see "An Entropy Coding System for Digital HDTV Applications", Shaw-Min Lei & Ming-Ting Sun, IEEE Transactions on Circuits and Systems for Video Technology, Vol. 1, No. 1, March 1991) implemented a LUT using a PLA. The PLA contained the code word bit sequence and the length of the bit sequence. The input to the PLA is the fixed length data from a run-leveler, and the output is the code word bit sequence and the length of the bit sequence. Vogel (see "Method and Apparatus for Bit Rate Reduction", Peter Vogel, U.S. Pat. No. 4,901,075, Feb. 13, 1990) described an implementation which used a PROM to implement a code table. The run-level fixed length data was applied directly to the address bus of the PROM, and the representation of the variable length bit sequence is output on the data bus.

Wilson & Tanaka (see "Variable Length Coder With a Small Table Size, Brent Wilson & Akiyoshi Tanaka, U.S. patent application No. 08/305,688, Sept. 13, 1994) reduced the size of the table using several techniques including using a combination of comparators and bitmaps to determine if the run-level combination had an existing variable length code stored in the code table, or if a fixed length escape code sequence would need to be used for coding the run-level combination. If the entry existed, a base table is used along with an adder to calculate the address in the code table of the variable length code word corresponding to the run-level combination. In addition, the width of the code table (word bit-width) is reduced by encoding the code word as a length of prefix zeros, a length of possibly non-zero bits, and the value of non-zero bits. The total size of memory required to implement Wilson & Tanaka's method for one run-level table of MPEG-2 video is 3008 bits.

There are several problems which this invention solves. Due to the rapidly changing digital A/V coding technology, and also due to the wide range of applications, the contents of the Huffman tables used for variable length coding may change. This results in a need for programmable variable length code tables. Contrary to programmability is the need for small implementation size so that inexpensive VLSI codecs can be made. An object of this invention is to implement a small, programmable architecture for run-level and variable length coding.

In H.261, MPEG-1 and MPEG-2, the Huffmnan tables are not continuous. Not every run-level combination exists, and of the combinations which do exist, they are not necessarily contiguous. For example, a code word for run=6, level=0, 1, 2, & 3 exist, but not for run=6, level=4, nor for run=7, level=3. This means that an implementation using conventional memory will have "holes"of unused memory, portions of memory which contain no useful information because the run-level combination has no code word. This is a waste of VLSI chip space. Alternatively, a PLA can be used but PLAs have more limited versatility than RAM. An object of this invention is to eliminate the wastage of code table space by the occurrence of holes in the Huffman tables.

For the purpose of solving the above-described problem, the present variable length coder was invented. In the present invention, a code table is used for storing code words each of which define a code word bit sequence and length of said bit sequence. Said code table is organized as a linked list of groups of said code words, said code words grouped according to the number of successive zero valued fixed length code values (run) which precede a non-zero fixed length code value (level), and said code words ordered within said groups consecutively according to the value of the corresponding fixed length code value. An address generator is used to calculate the code table address for accessing said code table based on the previous code table address pointer (the link to the next group), and on said fixed length code input. An escape code decider is used for deciding if said fixed length code sequence has an entry in said code table. An escape coder is used for calculating escape codes, said escape codes means for defining said variable length codes corresponding to sequences of fixed length codes which do not have an entry in said code table. An escape selector is used for selecting said escape codes or said code words from said code table to be said variable length codes which are the output of said variable length coder. A code valid decider is used for deciding if said sequence of fixed length codes have a corresponding variable length code.

SUMMARY OF THE INVENTION

This invention eliminates the wastage of code table space by the occurance of holes in the huffman tables by using a linked list to effectively jump over the holes. Initially, when the first fixed length code of a stream of codes is input, the code table address pointer is set to the table base, which is where the first group of code words is stored. This group corresponds to run=0, level=1, 2, etc. up to a maximum level. Variable length codes are output only when non-zero fixed length code inputs occur, as determined by the code valid decider. A comparison of the fixed length code input to the maximum for that group determines if the code word is found in the code table. This comparison is performed by the escape code decider. If it is in the code table, the escape code selector selects the code table output to be the output of the variable length code output. If it is not in the code table, the escape code selector selects the escape coder output to be the output of the variable length code output. The escape coder outputs a fixed length escape sequence code for the fixed length code input. If a zero valued fixed length code input occurs, the code table address pointer is updated with the link to the next group. This corresponds to incrementing the run counter. This process is repeated for every consecutive zero valued fixed length code input until the end of the input sequence is reached, or the end of the table is reached. Once the end of the table is reached, the escape code decider will decide that the escape code selector should select the escape coder output. Each time a valid code is output, the code table address pointer is set to the table base which is the start of the linked list.

DESCRIPTION OF THE PREFERRED EMBODIMENTS

Figure 1:
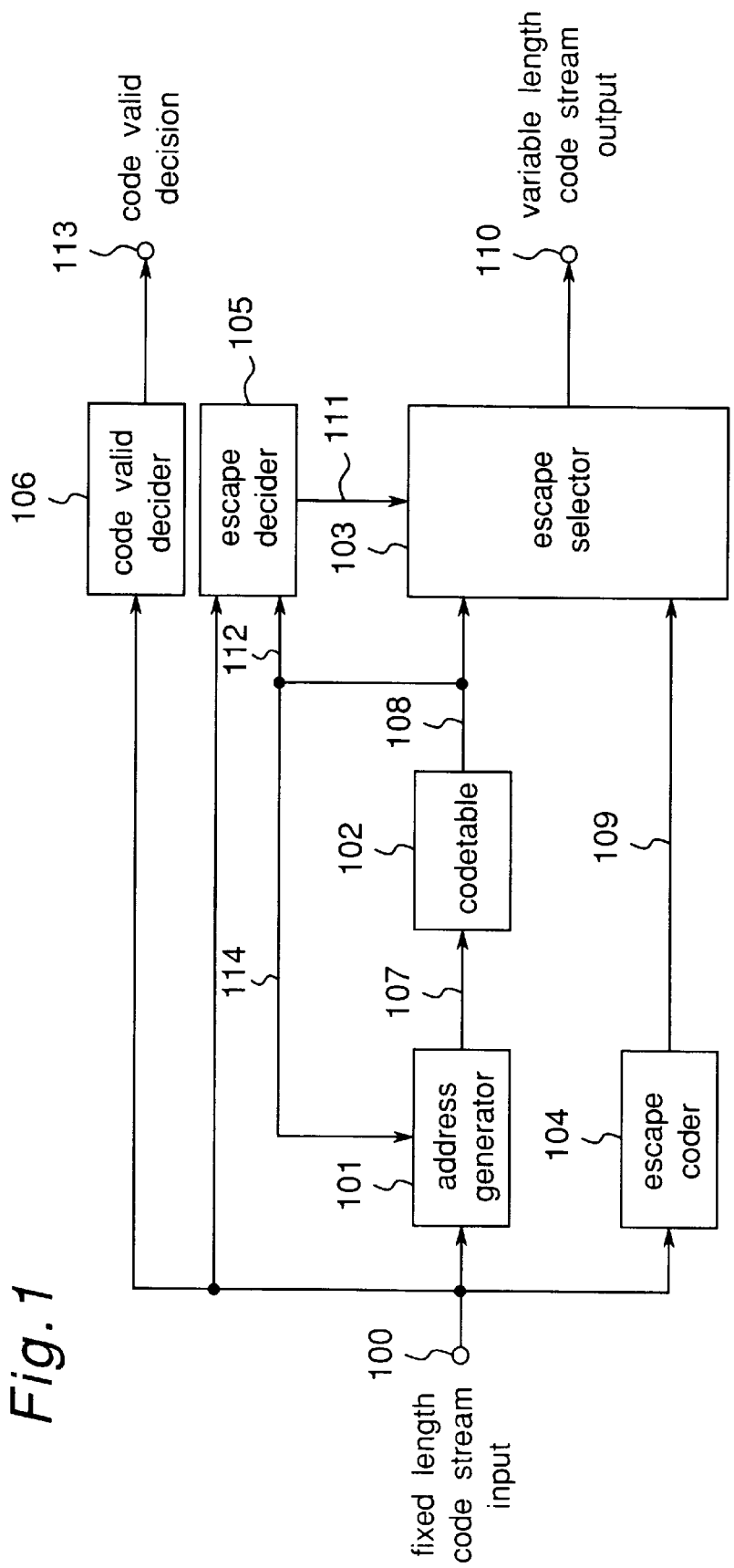
FIG. 1 is a block diagram describing one embodiment of the present invention.

An example embodiment of this invention is shown in FIG. 1. The fixed length code stream input 100 passes fixed length codes to the address generator 101 which generates a code table address 107 used to index the code table 102 from the fixed length code stream input 100 and the code table address pointer 114. The code table output 108 is passed to the escape selector 103 which selects the escape codes 109 from the escape coder 104 or the code table output 108 for output 110. The escape decision 111 is made by the escape code decider 105 based on the fixed length code stream input 100 and the next group maximum value 112. The code valid decider 106 is used to make the code valid decision output 113.

Figures 2, 3:
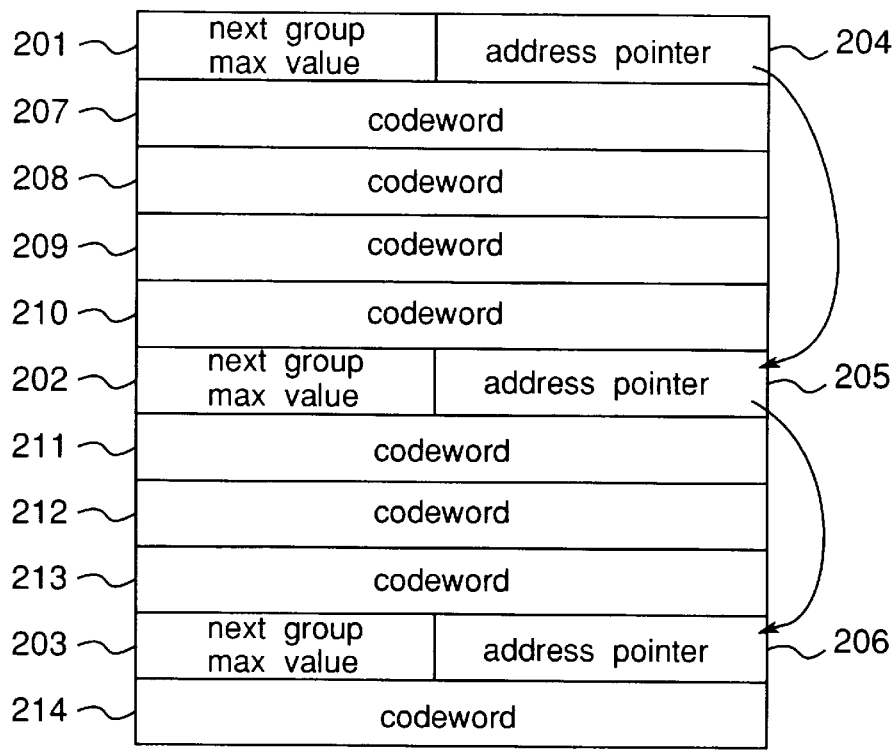
FIG. 2 is a diagram describing one embodiment of the structure of the code table according to the present invention.
FIG. 3 is a diagram describing one embodiment of the contents of the code table according to the present invention.

FIG. 2 describes the code table 102 contents for the example embodiment shown in FIG. 1. The code table 102 for this embodiment contains the values for the next group maximum value 201–203, the code table address pointer 204–206, and the code words 207–214 for each group of runs. Each of the code words 207–214 contain information indicating the bit sequence and length of the bit sequence corresponding to the appropriate run-level combination.

FIG. 3 describes the code table 102 contents for a more specific example of the same embodiment. In this example, the code table 102 contains code words for run=0 & level=1 to 4, run=1 & level =I to 3, run=2 & level=1. The maximum value for the run=1 group 301 is 3. The maximum value for the run=2 group 302 is 1, and the maximum value for the run=3 group 303 is 0. This embodiment uses a maximum value of 0 to indicate the end of the code table. The first code table address pointer 304 is set to the address of the run=1 group, where another pointer is located. The second pointer 305 is set to the address of the run=2 group, and the last pointer 306 is not used in this embodiment.

The operation of the embodiment described in FIG. 1 using the code table 102 described by FIG. 3 is now described. The address generator 101 calculates the code table address 107 used to index the code table 102. When the first fixed length code input is input via the fixed length code stream input 100, the code table address 107 is set to the base address of the code table 102 plus the value of the first fixed length code. If the first fixed length code does not exceed the run=0 group maximum, which in this example is level=4, then the code table address 107 contains the address of the code word corresponding to run=0 & level=first fixed length code. If the first fixed length code exceeds the run=0 group maximum, then the escape code decider 105 makes the escape decision 111 which indicates to the escape selector 103 to select the escape codes 109 from the escape coder 104 to be the variable length code output 110 for this input. If the first fixed length code is zero, then the code table address 107 contains the address of the code table address pointer 304 which points at the run=1 group. For the next fixed length code input, the sum of this code table address pointer 304 will be added to the fixed length code input. Also for the next fixed length code input, the next group maximum 301, which is 3, is used by the escape code decider 105 to make the escape decision 111. In this way, the linked list is traversed for every fixed length code input which has the value zero. Every non-zero fixed length code input results in a variable length code output, at which time the address generator 101 resets the linked list access to the base of the code table.

The effect of this embodiment described by FIGS. 1 and 3 are that the code table 102 is a linked list of groups of run-level codes, with no wasted holes in the code table memory map. This embodiment shows that run-level coding is not done separately from variable length coding, but rather at the same time as the fixed length data inputs occur, resulting in a much simplified architecture.

Figure 4:
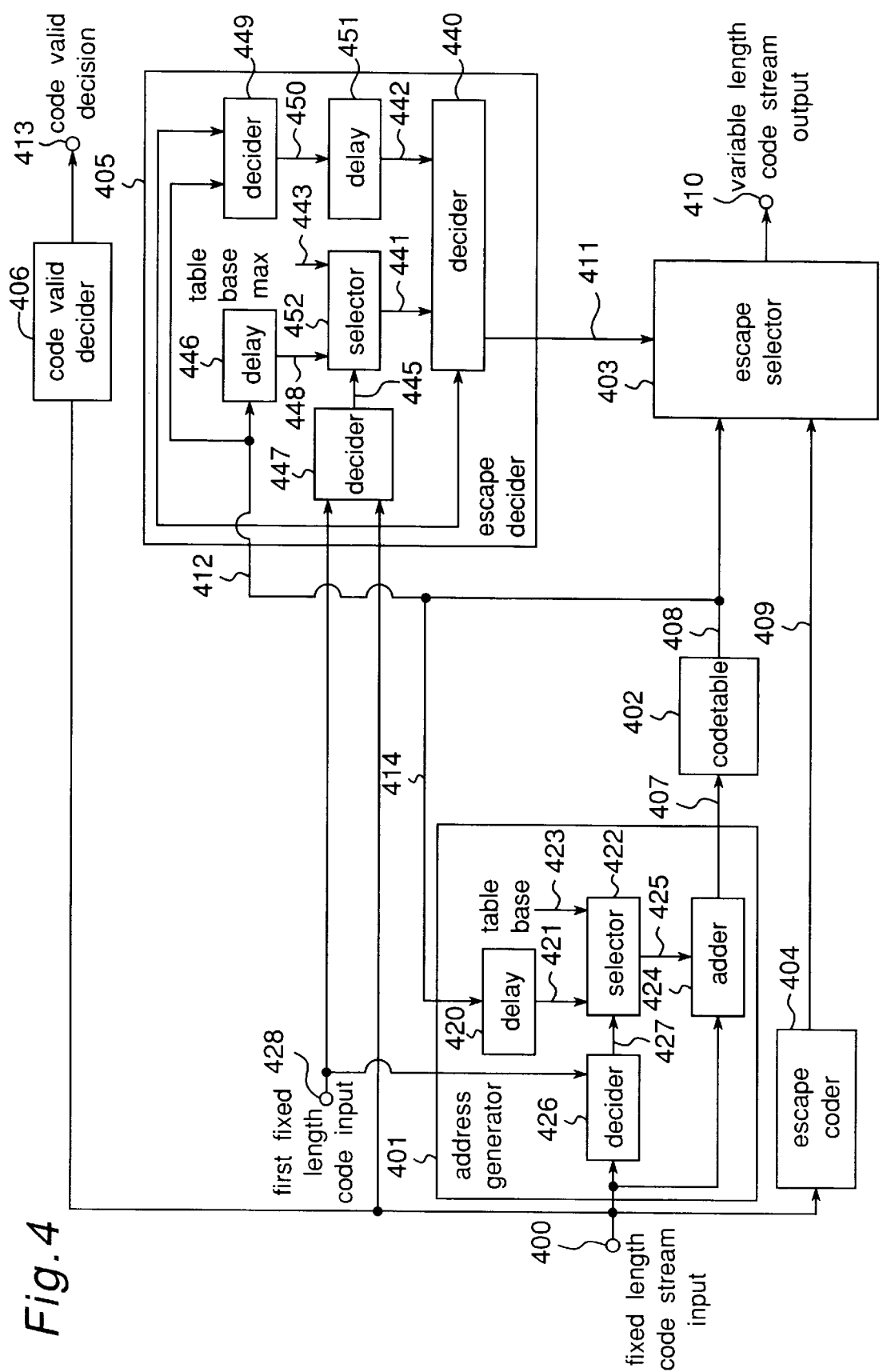
FIG. 4 is a block diagram describing one embodiment of the present invention.

Another embodiment of this invention is shown in FIG. 4. This embodiment shows more details of the address generator 401, escape code decider 405 and code valid decider 406. The address generator 401 in this embodiment has a code table address pointer input 414 which is delayed by the code table address pointer delay 420. Delays such as these could be accomplished by, but are not limited to being accomplished by a clocked register. This delayed code table address pointer 421 is passed to the table base selector 422 which selects either the delayed code table address pointer 421 or the table base 423 as the input to the address adder 424. The address adder 424 adds the table base selector output 425 to the fixed length code input 400 to generate a code table address 407. The set table base decider 426 makes the set table base decision 427 which indicates what the table base selector 422 should output. In this embodiment, the set table base decider 426 sets the table base 423 if the previous fixed length code input 400 is non-zero, or if the fixed length code input is the first of sequence, as indicated by the first fixed length code input 428.

The escape code decider 405 in this embodiment has an escape decider 440 which indicates the escape decision 411 to select the escape codes 409. This decision is based on whether the fixed length code input 400 is non-zero and either the fixed length code input 400 exceeds a maximum 441 or the delayed table end decision 442 is true. The maximum 441 is selected by the maximum selector 452 from either the table base maximum 443 which is the maximum level in the run=0 group of the code table 402 or the delayed next group maximum value 448. The set maximum decider 447 makes the set maximum decision 445 which indicates what the maximum selector 452 should output. In this embodiment, the set maximum decider 447 sets the table base maximum 443 if the previous fixed length code input 400 is non-zero, or if the fixed length code input is the first of sequence, as indicated by the first fixed length code input 428. The next group maximum 412 is delayed by the-next group maximum delay 446 to determine the delayed next group maximum 448 used by the maximum selector 452. The table end decider 449 makes the table end decision 450 based on whether the fixed length code input 400 is zero and the next group maximum value 412 is zero. This result is delayed by the table end decision delay 451 resulting in the delayed table end decision 442.

The code valid decider 406 in this embodiment decides the variable length code output 410 is valid if the fixed length code input is non-zero. The result of this is the code valid decision 413.

Figure 5:
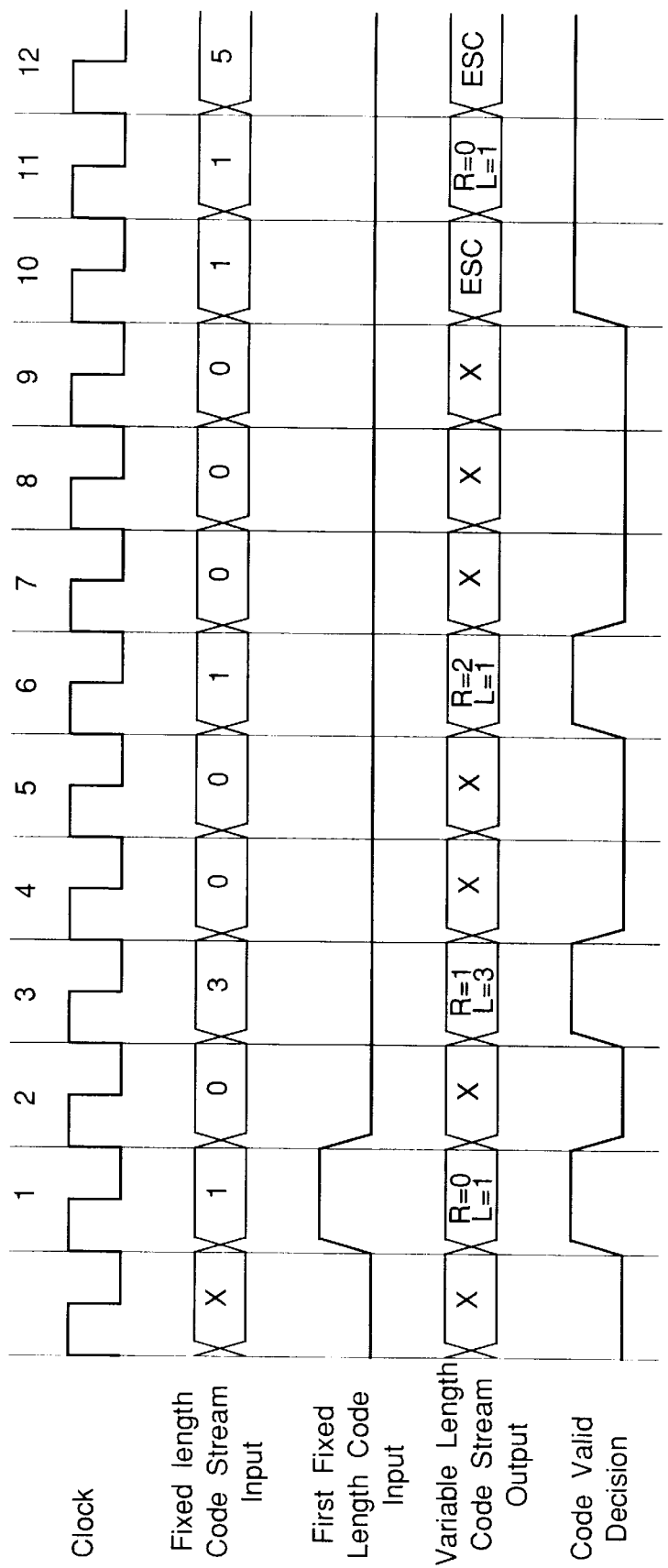
FIG. 5 is a timing diagram describing an example of the timing of one embodiment of the present invention.

FIG. 5 shows a timing diagram describing by example the operation of the embodiment of FIG. 4 using the code table of FIG. 3. In time period 1, the first fixed length code is input. It has the value 1. The resulting variable length code output is for a run=0 & level=1. In time period 2, the fixed length code input is 0. In time period 3, the fixed length code input is 3, and the resulting variable length code output is for a run=1 & level=3. This is followed by two fixed length code inputs which are zero, and a 1, which results in a variable length code output for run=2 & level=1. This is followed by three fixed length code inputs which are zero, and a 1, which results in an escape code for the variable length code output. This is because the code table shown in FIG. 3 does not contain code words for run=3. This is followed by a fixed length code input equal to 1, which results in a variable length code output for run=0 & level=1. This is followed by a fixed length code input equal to 5, which results in an escape code for the variable length code output. This is because the code table shown in FIG. 3 does not contain code words for run=0 & level=5. Thus, this diagram shows by example a sequence of fixed length code inputs (1, 0, 3, 0, 0, 1, 0, 0, 0, 1, 1, 5) which results in code words corresponding to variable length code outputs with the desired sequence (run=0 & level=1, run=1 & level=3, run=2 & level=1, escape for run=3 & level=1, run=0 & level=1, escape for run=0 & level=5).

Another embodiment of this invention could replace the table of FIG. 3 with a table containing the table 0 run-level variable length code words for MPEG-2. The code words could be stored in 16 bit words corresponding to a 4 bit length of prefix zeros, a 4 bit length of suffix bits, and an 8 bit suffix bit string. In addition, the next group maximum value could be contained using 6 bits in the same code table word as the code table address pointers, which is 8 bits wide. Thus, this table can be stored using approximately 144 words×16 bits of memory, or 2304 bits.

The effects of these embodiments include the implementation of run-level coding variable length code tables using much smaller memory size than other methods. It does not require the run-level combination to be determined before the code table look-up can be performed. It is a simple design requiring little logic, and able to output up to one variable length code every fixed length code input. The code table is easily implemented using RAM, and new code words added or removed as required, resulting in a versatile design allowing the code table to be easily modified.

It is not a limitation of this invention to require only positive valued fixed length inputs. This invention can be used for sequences of fixed length codes which are signed both positive and negative valued. On method, but not the only method to do so is to extract the sign before it is passed to the coder as a positive valued fixed length code. The sign could then be added to the resulting variable length code output. This invention does not specify the method of storing code words. The example embodiment describing the storage of table 0 MPEG-2 run-level variable length codes describes a method using 16 bits as an example of how the invention results in a smaller table size than other methods in the prior-art. The method of indicating the end of the linked list is not specified by this invention. The embodiments use a next group maximum value code table entry equal to 0 to indicate this as an example only, but any other suitable method can be used. In the examples shown, the code table address pointers and next group maximum values are stored as words in the code table. It is not a requirement of this invention that they must be stored in this way. For example, another memory could be used for this purpose.

An effect of this invention is the reduction in the size of the variable length coder, whilst maintaining significant programmability so that support of various Huffman code tables is possible with the same implementation. One effect of using a linked list to store the code table is the elimination of the wastage of code table space by the occurrence of holes in the Huffman tables. This means, for example, the code table can be implemented using a smaller memory on a VLSI codec chip. The result is that less expensive VLSI codecs can be made. Another effect of this invention is the implementation is a programmable architecture for run-level and variable length coding suitable for a wide range of applications, especially in the field of digital Audio/Video coding. The variable length code words used to code run-level combinations is easily modified by changing only the contents of the code table, without affecting the logic. The effect of this is that the invention can easily be used in applications which have differing code tables.

What is claimed is:

1. A circuit arrangement for a variable length coder for converting a stream of fixed bit length codes to a stream of variable bit length codes comprising:

a fixed length code stream input for inputting sequences of fixed length codes;

a variable length code stream output for outputting sequences of variable length codes;

a code table for storing code words, said code words means for defining the bit sequence and length of said bit sequence of said variable length codes;

an address generator for calculating the code table address, said code table address used to index said code table;

an escape coder for calculating escape codes, said escape codes means for defining said variable length codes corresponding to sequences of fixed length codes which do not have an entry in said code table;

an escape selector for selecting said escape codes or said code words to be said variable length codes which are the output of said variable length coder;

an escape code decider for deciding if said fixed length codes have an entry in said code table;

a code valid decider for deciding if said sequence of fixed length codes have a corresponding variable length code.

2. A circuit arrangement for a variable length coder for converting a stream of fixed bit length codes to a stream of variable bit length codes according to claim 1 wherein said code table comprises:

a linked list of groups of said code words, said code words grouped according to the number of successive zero valued fixed length code values which precede a non-zero fixed length code value, and said code words ordered within said groups consecutively according to the value of the corresponding fixed length code value;

code table address pointers linking said groups of said code words, said code table address pointers each pointing to the next successive group, sequenced according to the ascending number of successive zero valued fixed length codes which precede a non-zero fixed length code;

a terminator indicator for indicating the end of the linked list.

3. A circuit arrangement for a variable length coder for converting a stream of fixed bit length codes to a stream of variable bit length codes according to claim 1 wherein said code table comprises:

a linked list of groups of said code words, said code words grouped according to the number of successive zero valued fixed length code values which precede a non-zero fixed length code value, and said code words ordered within said groups consecutively according to the value of the corresponding fixed length code value;

code table address pointers linking said groups of said code words, said code table address pointers each pointing to the next successive group, sequenced according to the ascending number of successive zero valued fixed length codes which precede a non-zero fixed length code;

next group maximum value, said next group maximum value used to identify the maximum value for non-zero fixed length code value in the group which follows according to the sequence of said code table address pointers;

a terminator indicator for indicating the end of the linked list.

4. A circuit arrangement for a variable length coder for converting a stream of fixed bit length codes to a stream of variable bit length codes according to claim 3 wherein said terminator indicator comprises:

a special next group maximum value entry for indicating that the next group does not exist in the code table, said special next group maximum value entry a unique value reserved for indicating the end of said code table.

5. A circuit arrangement for a variable length coder for converting a stream of fixed bit length codes to a stream of variable bit length codes according to claim 3 wherein said linked list of groups comprises:

an organization of groups and code table address pointers in which said code table address pointers are located in the first location of each of said code table groups.

6. A circuit arrangement for a variable length coder for converting a stream of fixed bit length codes to a stream of variable bit length codes according to claim 1 wherein said code valid decider comprises:

a zero comparator for comparing said fixed length data code value to zero;

a code valid decision which indicates the existence of said variable length code, said existence being true if said zero comparator determines that the fixed length code value is non-zero.

7. A circuit arrangement for a variable length coder for converting a stream of fixed bit length codes to a stream of variable bit length codes according to claim 1 wherein said address generator comprises:

a code table address pointer delay for delaying said code table address pointer corresponding to one fixed length code input in said stream of fixed length code inputs;

a table base selector for selecting said delayed code table address pointer or the table base pointer, said table base pointer corresponding to the code table address pointer which points at the first group in said code table;

a set table base decider for deciding whether said table base selector should select said delayed code table address pointer or the table base pointer;

an address adder for adding the pointer from said table base selector to said fixed length code input, said address adder result being the code table address.

8. A circuit arrangement for a variable length coder for converting a stream of fixed bit length codes to a stream of variable bit length codes according to claim 7 wherein said set table base decider comprises:

a zero comparator for comparing previous fixed length data code value to zero;

a set table base decision which indicates whether said table base selector should select said delayed code table address pointer or the table base pointer, said set table base decision based on said zero comparator determining that said previous fixed length code is non-zero or said fixed length code is the first in a sequence to be variable length coded.

9. A circuit arrangement for a variable length coder for converting a stream of fixed bit length codes to a stream of variable bit length codes according to claim 1 wherein said escape code decider comprises:

a next group maximum value delay for delaying said next group maximum value corresponding to one fixed length code input in said stream of fixed length code inputs;

a maximum selector for selecting said delayed next group maximum value or the table base maximum, said table base maximum corresponding to the maximum value for non-zero fixed length code value in the first group in said code table;

a set maximum decider for deciding whether said maximum selector should select said delayed next group maximum value or said table base maximum;

a table end decider for deciding if the traverse of said code table linked list of groups corresponding to a sequence of zero valued fixed length codes has resulted in the end of said linked list of groups being reached;

a table end decision delay for delaying said table end decider decision corresponding to one fixed length code input in said stream of fixed length code inputs;

an escape decider for determining the escape decision, said escape decision for deciding if said fixed length codes have an entry in said code table.

10. A circuit arrangement for a variable length coder for converting a stream of fixed bit length codes to a stream of variable bit length codes according to claim 9 wherein said set maximum decider comprises:

a zero comparator for comparing previous fixed length data code value to zero;

a set maximum decision which indicates whether said maximum selector should select said delayed next group maximum value or said table base maximum, said set maximum decision based on said zero comparator determining that said previous fixed length code is non-zero or said fixed length code is the first in a sequence to be variable length coded.

11. A circuit arrangement for a variable length coder for converting a stream of fixed bit length codes to a stream of variable bit length codes according to claim 10 wherein said table end decider comprises:

a zero comparator for comparing said fixed length data code value to zero;

a set table end decision which indicates whether the traverse of said code table linked list of groups corresponding to a sequence of zero valued fixed length codes has resulted in the end of said linked list of groups being reached, said set table end decision based on said zero comparator determining that said fixed length code is zero and said delayed next group maximum value indicates the end of the table has been reached.

12. A circuit arrangement for a variable length coder for converting a stream of fixed bit length codes to a stream of variable bit length codes according to claim 9 wherein said escape decider comprises:

a zero comparator for comparing said fixed length data code value to zero;

a maximum comparator for comparing said fixed length data code to the maximum selected by said maximum selector;

an escape decision logic which make said escape decision, said escape decision based on said delayed table end decision indicating the table end has been reached, or said zero comparator determining that said fixed length code is non-zero and said maximum comparator has determined that said fixed length data code is greater than said maximum selected by said maximum selector.

* * * * *